United States Patent [19]

Johnson et al.

[11] Patent Number: 4,914,631
[45] Date of Patent: Apr. 3, 1990

[54] PULL UP CIRCUIT FOR SENSE LINES IN A SEMICONDUCTOR MEMORY

[75] Inventors: Gary M. Johnson; Zhitong Chen; Wen-Foo Chern; Ward D. Parkinson; Tyler A. Lowrey; Thomas M. Trent, all of Boise, Id.

[73] Assignee: Micron Technology, Inc., Boise, Id.

[21] Appl. No.: 252,585

[22] Filed: Sep. 30, 1988

[51] Int. Cl.$^4$ .............................................. G11C 7/00
[52] U.S. Cl. .............................. 365/189.11; 365/210; 365/205
[58] Field of Search ...................... 365/189.11, 189.06, 365/203, 204, 205, 190, 210; 307/530

[56] References Cited

U.S. PATENT DOCUMENTS 4,578,778  3/1986  Aoyama .............................. 365/190
4,679,172  7/1987  Kirsch et al. ...................... 365/190

Primary Examiner—Glenn A. Gossage
Attorney, Agent, or Firm—Stanley N. Protigal; Angus C. Fox, III; Jon P. Busack

[57] ABSTRACT

A memory array (e.g., DRAM) is provided with a potential maintenance circuit which provides sufficient current to maintain a high potential node of the memory array at a predetermined potential. The potential maintenance circuit is gated ON after receipt of a clock signal and gated OFF at the predetermined potential. This permits the high voltage node to be maintained, while reducing current requirements. The invention is particularly useful when used in conjunction with a circuit which rapidly pulls up the high node to a value of $V_{CC}-V_T$ (where VT is a threshold voltage of a transistor).

17 Claims, 6 Drawing Sheets

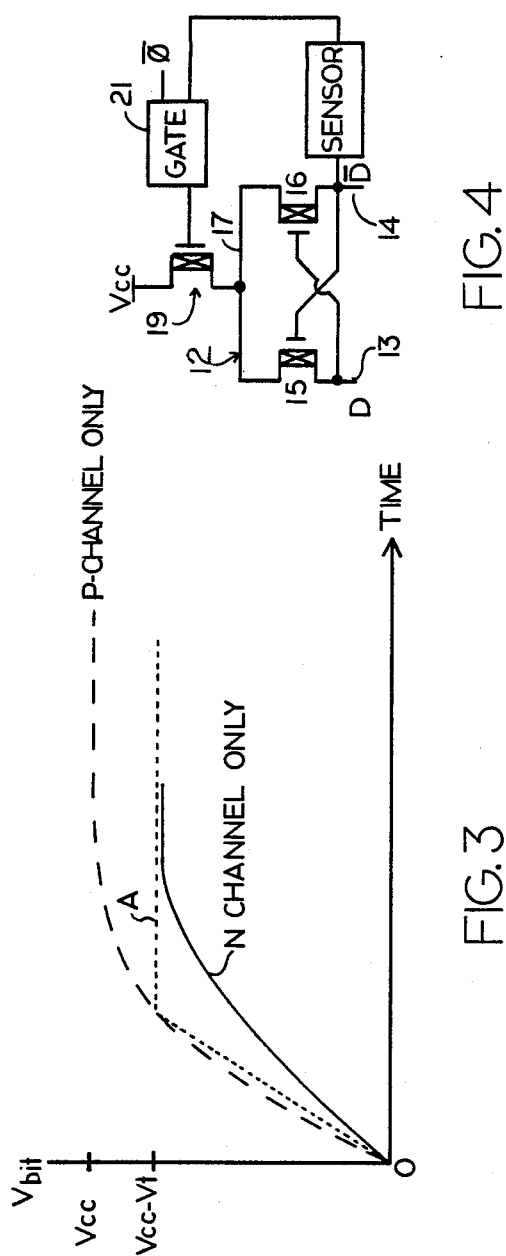

4,914,631

PULL UP CIRCUIT FOR SENSE LINES IN A SEMICONDUCTOR MEMORY

FIELD OF THE INVENTION

This invention relates to semiconductor circuit devices and more particularly to circuitry for charging sense lines on semiconductor integrated circuits in which a node is rapidly pulled to a high potential. The invention is particularly applicable to dynamic random access memory devices (DRAMs).

BACKGROUND OF THE INVENTION

The invention uses various materials which are electrically either conductive, insulating or semiconducting, although the completed semiconductor circuit device itself is usually referred to as a "semiconductor". One of the materials used is silicon, which is used as either single crystal silicon or as polycrystalline silicon material, referred to as polysilicon or "poly" in this disclosure.

In the operation of certain semiconductor circuit devices, it is necessary to draw up a node of the sense amp to a high potential, for example, a potential approaching $V_{CC}$. This node occurs on an array of a memory device such as a DRAM (dynamic random access memory). Other types of memory devices, such as static RAMs and video RAMs also may have such a circuit arrangement.

There are reasons that it is desirable that the node be pulled to a lower potential, such as $V_{CC}-V_T$ (where $V_T$ is a threshold voltage of a transistor). If cell signal is large, it is desirable to very rapidly bring the potential of desirable to very rapidly bring the potential of the node to a high value. The biasing of this node enables the sense amp to sense a differential in signals between signal sources, such as between digit and digit* lines. If the node is at a low potential, the time for the sense amp to detect the differential in signal levels of the digit and digit* lines is greatly reduced. For the same reasons, it is advantageous to very rapidly bring the potential of the node to the high value.

Design objectives for the pull-up circuitry are: (1) to pull digit line (bit line) up as fast as possible, and (2) to keep the final potential less than ($V_{CC}-V_{TN}$), thereby lowering the equilibrate voltage and improving "1s" margin in the memory cell.

Thus far, the two conventional techniques, shown in FIGS. 1 and 2, have been widely used in the industry. Each of these implementations can only meet one of the two design objectives.

In one prior art technique, the memory array was strobed to a potential of $V_{CC}$ by gating a p-channel pull-up transistor.

The pumping of the node to $V_{CC}$ resulted in current consumption which would have been unnnecessary if the node were pumped to a lower value.

An alternate technique used an n-channel pull-up transistor or similar device to reduce the potential of the array after the pull up strobe to $V_{CC}-V_T$. This tended to slow the reaction time of the circuit because as the potential of the node approached $V_{CC}-V_T$, the change in potential would tend to slow, resulting in the potential of the node hyperbolically approaching that value.

If, as shown in FIG. 1, a prior art configuration with an n-channel transistor is used to connect the pull-up circuitry to $V_{CC}$, the circuit suffers speed degradation, as shown in FIG. 3 (lower curve). Due to the source-follower configuration, as the gate of the pull up device rises, the source follows the gate. This keeps potential of the device to a minimum, and keeps the device "barely" on. This results in the source of the n-channel device being slowly pulled up to $V_{CC}-V_{TN}$.

The prior art p-channel case, shown in FIG. 2, suffers no speed loss because when the gate of the pull-up transistor goes low, the device turns on hard, pulling its drain up to $V_{CC}$ very quickly. The disadvantage is that the equilibrate voltage will be higher, causing a reduction in "1s" margin in the memory cell.

The inventive scheme combines the advantages of the above two configurations. It pulls the digit line towards $V_{CC}$ very quickly using a p-channel pull up to preserve the speed advantage and clamps the final level at $V_{CC}-V_T$, giving a lower equilibrate voltage, and ensuring good "1s" margin.

It would be desirable to have the potential of the node rise rapidly, as in the case of a p-channel transistor connection, but settle at a potential of $V_{CC}-V_T$.

SUMMARY OF THE INVENTION

In accordance with the present invention, a voltage sensing circuit for a reference array is used to control the pullup of a high node of a memory array. The high node of the memory array is rapidly pulled up to a value of $V_{CC}-V_T$. During an enable cycle, the high node is precharged to a potential of $V_{CC}-V_T$, which turns on a transistor gated to the $V_{CC}$ potential.

Biasing the digit and digit* lines to a potential $V_T$ below $V_{CC}$ also has the benefit of reducing current (amperage) requirement, because the digit and digit* lines do not have to be charged completely to $V_{CC}$. Consequently:

(1) In order to sense the reference signal of a DRAM at the reference digit line, the high node must pull from the same potential as the digit line to a high level, which typically is $V_{CC}$.

(2) It is desirable to pull-up the high node as rapidly as possible to a high level in order to speed up the sensing process. The most efficient way of accomplishing this process is to pull the high node directly to $V_{CC}$ through a transistor of a large size.

(3) When the high node has been charged to the $V_{CC}-V_T$ level, the digit or digit* lines will settle at that level.

(4) By leaving the high node at $V_T$ below $V_{CC}$, this will contribute directly to reduction in operating current.

In a further aspect of this invention, during precharge cycle, a low voltage latch node is precharged to a potential of $V_{SS}+V_T$, which turns on a transistor gated to ground potential. A first active signal gates a precharge transistor to a ground connection, thus allowing the sensing node to discharge to ground. When the sensing node is at a potential of $V_{SS}+V_T$, the precharge circuit is gated off and the differential signals can be sensed. The sensing node is maintained at a level above ground by leakage current through a pump-up circuit.

By biasing the sense amp pull-down node to a potential $V_T$ above ground, this automatically back biases the access device, which is an n-channel access device. The access device is back biased negative with respect to the digit and digit* lines. The back biasing limits leakage current through the access device and therefore there is no requirement for a high $V_T$ for proper signal retention. Biasing the digit and digit* lines to a potential $V_T$ above ground also has the benefit of reducing current (amperage) requirement, because the digit and digit* lines do not have to be discharged completely to ground. The monentary discharge of the sense amp node to ground allows the sense amp to behave like a conventional sense amp during initial sensing, thereby allowing a minimum digit/digit* sensing potential to approximate ground plus $V_T$. Consequently:

(1) In operation of the DRAM, in order to sense the cell signal, as transferred to the digit line, the N latch node must pull from the same potential as the digit line ($V_{CC}$ or $V_{CC}/2$) to a low level, which typically is ground potential.

(2) It is desirable to pull the N latch node as rapidly as possible to low level in order to speed up the sensing process. The most efficient way of accomplishing this process is to pull the N latch node directly to ground through a signal transistor of a large size.

(3) When the N latch node is at ground, the digit or digit* lines that discharged to a low level will settle at ground. In doing so, the pump substrate must either be at a negative potential to increase the effective $V_T$ of the access device or the actual $V_T$ of the access device must be greatly increased so that leakage current through the device is minimal when digit is at ground.

(4) Increased $V_T$ of access device directly cuts into amount of charge that can be stored at cell, which cuts into operating margins of the chip. Also, smaller amounts of cell charge dictates that the N latch node must be pulled low slower in order to effect sensing.

(5) The N latch node being left at $V_T$ above ground and substrate at ground, achieves the effect of back biasing the access device, allowing the $V_T$ of the access device to be lower than where the N latch node pulls all the way to ground.

(6) By leaving the N latch node at $V_T$ above ground instead of ground, this will contribute directly to reduction in operating current.

BRIEF DESCRIPTION OF THE DRAWINGS

FIG. 3 is a graph showing speed and amplitude of sense line pull-up using n-channel and p-channel devices;

FIG. 4 shows a pull-up circuit constructed in accordance with the present embodiment;

DETAILED DESCRIPTION OF THE PREFERRED EMBODIMENT

Figure 2:
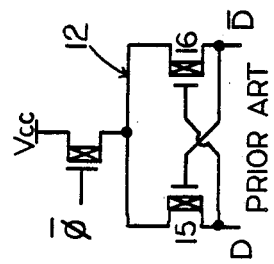
FIGS. 1 and 2 are schematic representations of prior art circuits, in which n-channel and p-channel transistors are used to pull up sense lines on a memory array.
Figure 1:
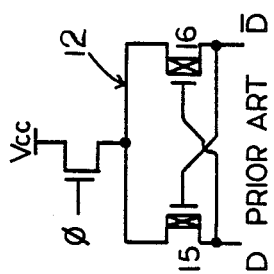

Referring to FIGS. 1 and 2, a pull-up amp 12 for a reference array consists of a plurality of cross-coupled transistors 15, 16 for detecting differential voltage (EMF) levels on reference digit and digit* lines (indicated as D and D*).

While circuit elements are shown and described, in the preferred embodiment, each of these circuit elements is formed as a part of a semiconductor circuit chip. The described circuit functions find particular utility when integrated onto the chip, although it is possible to utilize the invention as one or more separate circuit elements.

The sources of transistors 15 and 16 are connected together and the drains of transistors 15 and 16 are connected to the reference digit and digit* lines, respectively. The gates of transistors 15 and 16 are cross-coupled to the digit and digit* lines respectively.

The pull-up amp 12 conducts from $V_{CC}$ to transistors 15 and 16 in order to restore "one" levels in the array to their full potential after "read" and "write" operations. This helps to restore the "1" level of the signal which had just been read.

In order to bring the high node to a desired potential, a gate control circuit 21, which functions as a potential controller, must conduct current from the high node.

The speed at which the high node is pumped up controls the time required to read and write the individual cells in the memory array, and consequentially the access speed. The access speed is generally considered to be the speed of the device.

The operation of the high node at a potential of $V_{CC}-V_T$ has the advantage that cell margin is increased and the reliability of the part is thereby increased. Operating the part with the high node at the potential of $V_{CC}-V_T$ reduces the power consumption of the part because of reduced leakage current.

If current to the high node were conducted by a transistor directly to $V_{CC}$ potential, then the potential of the high node would rise more rapidly, but would continue to rise to the $V_{CC}$ potential, as shown in the curve marked "p-channel" in FIG. 3. Power consumption of the part increases because the high node at highest potential brings the digit* line to the same high potential, thus drawing more operating current and reducing cell margin.

Curve A in FIG. 3 shows a desired characteristic in which the high node is conducted to $V_{CC}$, but is then held at a potential of $V_{CC}-V_T$.

The curves in FIG. 3 are shown to explain the operation of the circuit and do not represent actual measurements of voltage over time.

FIG. 4 shows a configuration by which a memory array 11 has its sense lines 13, 14 brought to a high level state. A high level node 17 is provided with current from a high potential source $V_{CC}$ through a pull-up transistor 19. The pull-up transistor 19 is gated ON by an enable signal, by providing the high level node 17 with current from the $V_{CC}$ voltage source.

If the pull-up transistor 19 is a p-channel transistor, then the high level node 17 is brought to a level approximating $V_{CC}$ because the threshold voltage of the pull-up transistor 19 does not cause the transistor 19 to gate OFF as the node 17 approaches $V_{CC}$. On the other hand, if the pull-up transistor 19 is a n-channel transistor (such as shown in FIG. 1) then the potential at the high level node 17 is brought to $V_{CC}-V_T$, with the pull-up transistor 19 gating OFF at that level. As can be seen from the graphs in FIG. 3, the high level node 17 takes longer to approach a desired level, such as $V_{CC}-V_T$, when the n-channel transistor is being used.

The dotted line on FIG. 3 shows a desired characteristic, where the node 17 is rapidly pulled up to a level of $V_{CC}-V_T$, but then held at the $V_{CC}-V_T$ level. This gives the advantage of the rapid pull-up characteristic of the p-channel transistor, but while only bringing the high level node 17 up to the potential achieved by the n-channel transistor. Additionally, the steeper part of the p-channel slope is utilized, thereby bringing the node 17 to its desired level at a faster speed than would be accomplished by bringing the high level node 17 to the $V_{CC}-V_T$ level.

Referring to FIG. 4, in order to accomplish this rapid pump up of the high level node 17, a gate control circuit 21 is used to control the pull-up transistor 19, with the pull-up transistor 19 being a p-channel transistor. The gate control circuit 21 is responsive to a clock signal which is used as an enable signal and to a sensor which senses potential levels on the memory array 11 by sensing potentials on a reference array (as will be described with respect to FIG. 5). Therefore, when the potential at the high level node 17 reaches its desired level, current supplied to the node 17 is decreased by gating the pull-up transistor 19.

Figure 5:
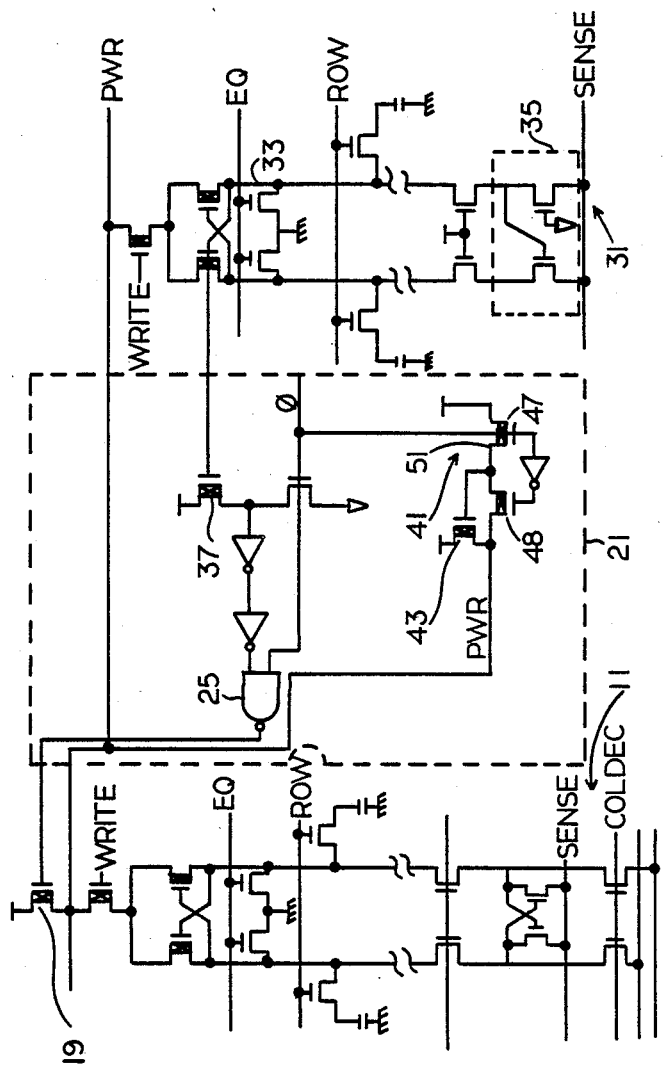
FIGS. 5 and 5a show a preferred embodiment of a voltage sensor and pull-up circuit for supplying a memory array with current.

FIG. 5 shows a preferred circuit for gating the pull-up transistor 19. The control circuit 21 is enabled by a clock signal $\phi$. A NAND gate 25 provides a gating signal to the pull-up transistor 19 in response to the clock signal $\phi$, provided that a sensed voltage signal is not received by the NAND gate 25. The sensed voltage signal is obtained by sensing voltage at a reference array 31, on the assumption that the time for charge of the reference array is the time needed to leave the pull-up transistor 19 in a conductive state.

The reference array 31 has a sense node 33, which is normally caused to go to a high level by a reference control circuit 35. A voltage sensing transistor 37 gates OFF when the potential at the sense node 33 reaches a predetermined level, which is approximately $V_{CC}-V_T$, provided that the clocking signal is cycled ON. At that time, NAND gate 25 provides a high signal, thereby gating the pull-up transistor 19 OFF.

The NAND gate 25 is enabled by the clock signal $\phi$ and transistor 37 permits the NAND gate 25 to remain OFF until the potential at the sense node 33 reaches the predetermined level. The predetermined level is thereby set below $V_{CC}$ by the threshold voltage ($V_T$) of transistor 37. The ON state of the NAND gate 25 then causes the pull-up transistor 19 to gate OFF when the clock signal is OFF or the reference voltage from node 33 is above $V_{CC}-V_T$.

A potential maintenance circuit 41, which can be considered to be a part of the gate control circuit 21, responds to the clock signal by providing power to the memory array 11 after the pull-up transistor 19 is gated OFF. A power maintenance transistor 43 is gated ON with the clocking signal and is gated OFF when the clock signal goes OFF and its output potential reaches $V_{CC}-V_T$. This is accomplished by gating a first power control transistor 47 OFF with the clocking signal and gating a second power control transistor 48 ON with the clocking signal.

When transistor 47 is conducting prior to transistor 47 being gated OFF, the gate of the power maintenance transistor 43 is at a high ($V_{CC}$) level. Transistor 43 is therefore gated OFF.

Transistor 47 is gated OFF by the enable signal, and transistor 48 is gated ON by the (inverted) enable signal to connect the gate of power maintenance transistor 43 to its drain. Under these circumstances, the potential at a power output node 51 controls the conductive state of the power maintenance transistor 43. If the potential of the power output node 51 reaches $V_{CC}-V_T$, then the power maintenance transistor 43 gates OFF in a manner represented by the "n-channel only" curve on the graph of FIG. 3. Therefore, the maintained potential of the high level node 17 of the memory array 11 is controlled by the threshold voltage of the power maintenance transistor 43.

In contrast with power transistors which are normally high current devices, power maintenance transistor 43 is actually a low current device and conducts less current than pull-up transistor 19. Therefore, transistors 19 and 43 would not be high amperage devices in the preferred embodiment.

It is, however, possible to configure a circuit in which a high current latch is used, although this would probably not be applied to DRAMs.

Figure 5A:
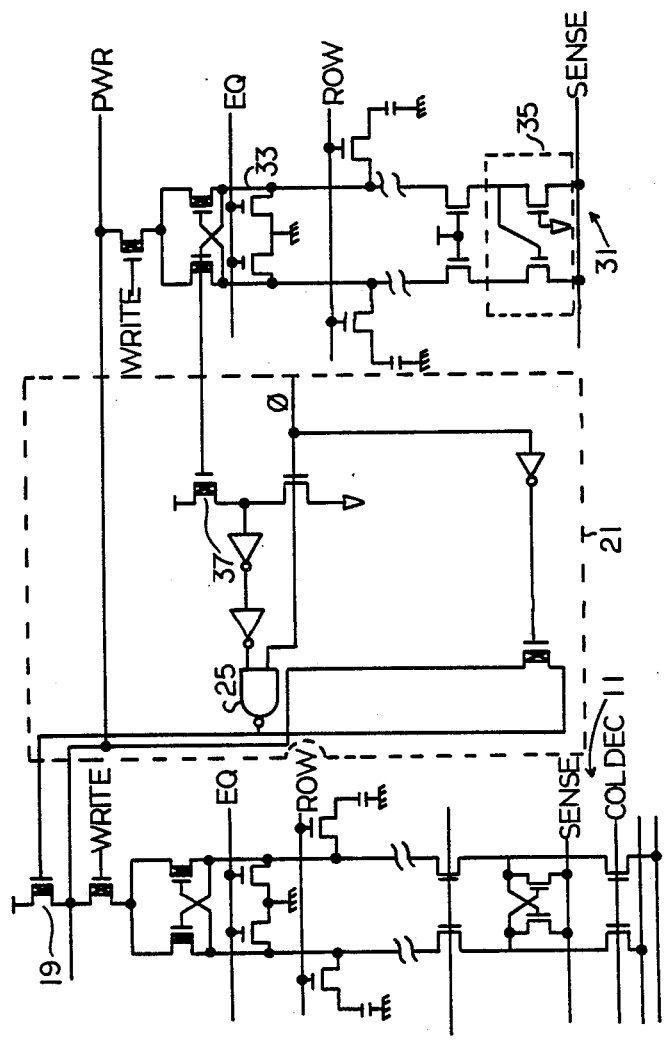

In the preferred embodiment, power maintenance transistor 43 is a lower current device than pull-up transistor 19 and conducts less current than pull-up transistor 19. This is because transistor 43 is discrete from transistor 19 in that embodiment. If transistor 19 is gated by the potential maintenance circuit 41, then clearly there would no difference in the current capacity of the transistor (transistor 19) when it is being used for pullup or used for potential maintenance. Since, at least in the preferred embodiment, transistor 19 is a p-channel transistor, the value $V_T$ would be established as the $V_T$ value of transistor 19. An example of the circuit using the pullup transistor 19 as the power maintenance transistor is shown in FIG. 5a.

Figure 6:
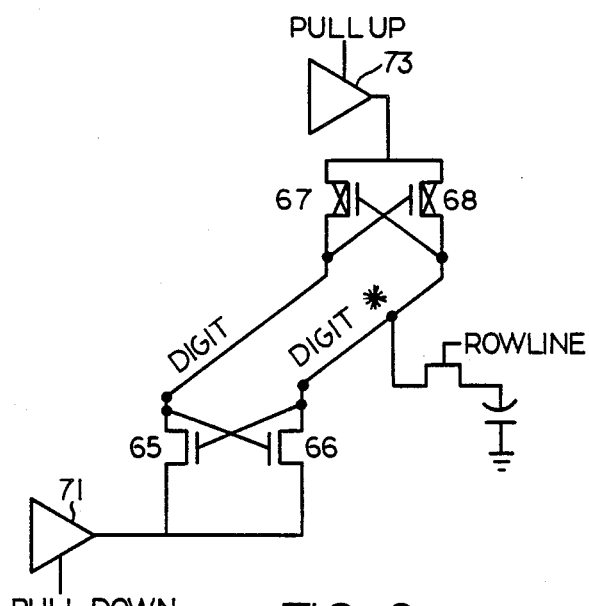
FIG. 6 shows a configuration for charge pumps for sense amp circuits.

Referring to FIG. 6, a sense amp consists of a plurality of cross-coupled transistors 65, 66, 67, 68 for detecting differential voltage (EMF) levels on digit and digit* lines.

Transistors 65 and 66 are connected at their sources to an N latch node, which functions as a low level voltage (EMF) source and their gate are cross-coupled to each other's drains. Their drains are connected to the digit and digit* lines respectively, so that their gates are responsive to the opposite digit or digit* lines in order that they may sense the differential signals on the digit and digit* lines.

Likewise, the sources of transistors 67 and 68 are connected to a pull-up amp 73 and the drains of transistors 67 and 68 are connected to the digit and digit* lines, respectively. The gates of transistors 67 and 68 are cross-coupled to the digit and digit* lines respectively, in order that transistor 67 and 68 can sense differential high levels on the digit and digit* lines.

The pull-up amp 73 conducts from $V_{CC}$ to transistors 67 and 68 in order to restore "one" levels in the array to their full potential after a "read" operation or during a refresh cycle. This helps to restore the "1" level of the signal which had just been read.

In order to bring the N latch node to a desired potential, an N latch charge pump 71, which functions as a pull-down amplifier, must conduct current from the N latch node. If the N latch charge pump 71 conducts current to the ground through a device (such as a diode) which has a threshold voltage ($V_T$), the potential at the N latch node will slowly pump down to a potential of ground+$V_T$, as shown in the top curve, marked Diode in FIG. 7.

The speed that the N latch node is pumped down controls the time required to read the individual cells in the memory array, and consequentially the access speed. The access speed is generally considered to be the speed of the device.

The operation of the N latch node at a potential of ground+$V_T$ has the advantage that the maximum time between refresh cycles is increased and the reliability of the part is thereby increased. Operating the part with the N latch node at the potential of ground+$V_T$ reduces the power consumption of the part because of reduced leakage current and the extension of time between refresh cycles. The operating margin of the part is reduced, however, because the minimum operating voltage $V_{CC}$ is increased in proportion to the increase in the N latch node potential.

Figure 7:
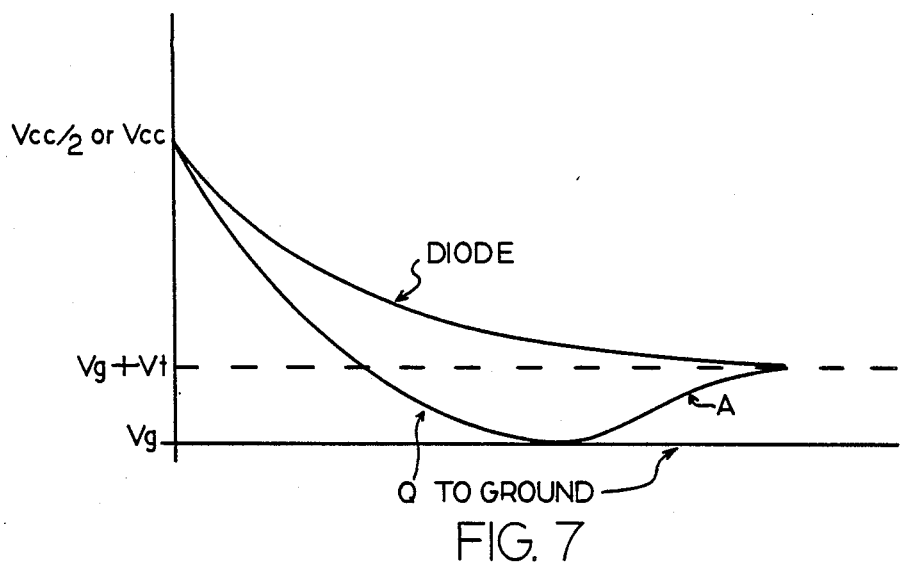
FIG. 7 is a graph, depicting charge pump operation in terms of voltage (EMF) over time.

If the N latch node were conducted by a transistor directly to ground potential, then the potential of the N latch node would drop more rapidly, but would continue to drop to ground potential, as shown in the curve marked "Q to Ground" in FIG. 7. Power consumption of the part increases because the N latch node at low potential brings the digit* line to the same low potential, thus drawing more operating current.

Curve A in FIG. 7 shows a desired characteristic in which the N latch node is conducted to ground potential, but is then permitted to float up to a potential of ground+$V_T$. The N latch node is then maintained at approximately the level of ground+$V_T$, rather than continuing to the low ground potential. In other words, the N latch node first rapidly is brought to a potential close to ground, decreasing access time and increasing the operating margin, and then the N latch node increases to a potential of ground+$V_T$. This shortens the access speed of the part and increases the operating margin, and then allows the maximum time between refresh cycles to increase and decreases power consumption.

The curves in FIG. 7 are shown to explain the operation of the circuit and do not represent actual measurements of voltage over time.

Figure 8:
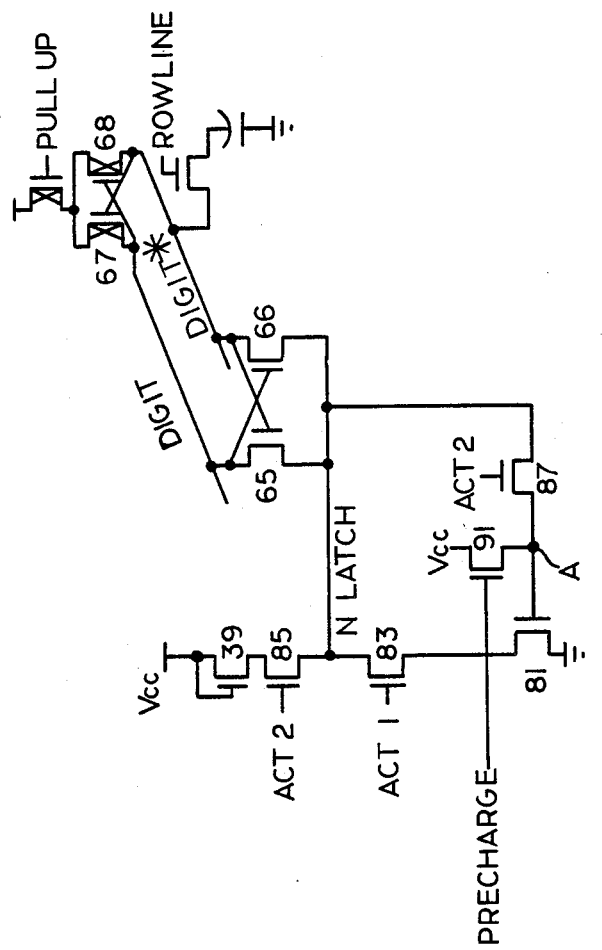
FIG. 8 shows a sense amp pump down circuit which reacts to changed potentials in order to shift characteristics in accordance with the invention.

Referring to FIG. 8, during a precharge cycle, node A is precharged to $V_{CC}-V_T$, turning on transistor 81. In an active cycle, signal ACT 1 turns on transistor 83, allowing the N latch node to discharge to ground, thus activating the cross-coupled transistors 65 and 66 to sense the differential signals on the digit and digit* lines.

A first active signal ACT 1 turns on transistor 83. Since transistor 81's gate is $V_{CC}-V_T$ (therefore on), the N latch node now has direct path to ground; thus ACT 1 starts the process of discharging the N latch node to ground.

After a predetermined delay later, a second active signal ACT 2 turns on transistors 85 and 87. Transistor 87 allows Node A to discharge to the same potential as the N latch node. This forms a diode configuration of transistor 81, and also turns on transistor 85. Transistor 85 is connected between the N latch node and a diode-connected transistor 89. A high potential voltage source, $V_{CC}$, in the preferred embodiment is, in turn, connected to transistor 89. When transistor 87 is gated ON in response to signal ACT 2, the leakage path through transistor 85 and threshold transistor 89 eventually pulls the N latch node and A to a potential of $V_T$ above ground potential.

Transistors 85 and 89 are much smaller than transistor 83 and therefore the high potential part of the circuit (85 and 89) has a relatively high internal resistance. Because transistor 85 has more resistance than transistor 83, the N latch node is floated only to ground potential+$V_T$. Potential conducted through transistor 87 regulates the gating of transistor 81, so that current through transistor 81 is limited when the potential at the N latch node approaches the potential of ground+$V_T$. If the N latch node were to be left floating in a long RAS* low cycle, the N latch node may leak to ground potential.

The N latch node is brought to $V_T$ above ground as a result of the circuit path which includes transistors 85 and 89 being highly resistive. Therefore, substantially more current leaks through transistor 83 until the potential of the N latch node approaches $V_T$ above ground potential. Therefore, transistor 85 pulls the N latch node from ground to $V_T$ above ground, and maintains the N latch node at $V_T$ above ground over long periods of active cycles. If transistor 85 were not present, the N latch node would float down to ground.

During precharge, ACT 1 and ACT 2 turns off transistors 83, 85 and 87, isolating the N latch node from power supply so the N latch node can equilibrate to mid-point ($V_{CC}/2$). Also, the precharge signal will turn on transistor 91, bringing node A to $V_{CC}-V_T$.

The ability of the N latch charge pump 71 to first conduct to ground potential and then to conduct to a potential of ground+$V_T$ has a similar effect on speed as causing the hyperbolic portions of Curves D (Diode) and Q in FIG. 7 to be truncated at desired potentials. The N latch node is allowed to hyperbolically settle to a quiescent voltage, but only after the potential is within a desired voltage range.

We claim:

1. Semiconductor memory device having a memory array, the memory device comprising:
   (a) a pullup circuit for conducting current from a high potential source to a high potential node of the memory array;
   (b) a gate control circuit for controlling the current supplied to the high potential node of the memory array from the high potential source,
   said gate control circuit including a potential maintenance circuit for providing sufficient current from the high potential source to maintain the high potential node of the memory array at a predetermined potential, the potential maintenance circuit being gated ON after receipt of a clock signal and being gated OFF at the predetermined potential;
   (c) a pair of digit lines coupled to said high potential node and to a low voltage latch node;
   (d) a first pull down transistor connected between the low voltage latch node and a circuit node, and gated ON in response to a first active signal;
   (e) a second pull down transistor connected between the circuit node and a low potential source in response to;
   (f) a voltage control transistor being responsive to a second active signal to conduct current from the low voltage latch node to a gate of the second pull down transistor;
   (g) a precharge circuit to gate the second pulldown transistor ON prior to the voltage control transistor responding to the second active signal; and
   (h) a threshold current supply transistor for providing sufficient current from the high potential source to float the low voltage latch node to a predetermined value above a potential of the low voltage source, wherein the threshold voltage supply transistor is gated ON in response to the second active signal.

2. Semiconductor memory device as described in claim 1, further comprising:
   a reference array,
   and wherein the gate control circuit includes a voltage sensor which senses a potential at a reference node of the reference array and gates OFF the pullup circuit when that potential reaches the predetermined potential.

3. Semiconductor memory device as described in claim 1, wherein:

the gate control circuit provides a signal to gate ON a pullup transistor in said pullup circuit until the high potential node reaches the predetermined potential.

4. Semiconductor memory device as described in claim 3, wherein:

the predetermined potential is the potential of the high potential source reduced by a threshold voltage of the pullup transistor.

5. Semiconductor memory device as described in claim 1, wherein:

the predetermined value is a threshold voltage of an n-channel transistor.

6. Semiconductor memory device as described in claim 5, further comprising:

a reference array, and wherein the gate control circuit includes voltage sensor which senses a potential at a reference node of the reference array and gates OFF the pullup circuit when that potential reaches the predetermined potential.

7. Semiconductor memory device as described in claim 6, wherein:

the semiconductor memory device is a dynamic random access memory (DRAM) device.

8. Semiconductor memory device as described in claim 1, wherein:

the low voltage latch node is coupled to the pair of digit lines through a pair of transistors, the pair of transistors being cross-connected so that each transistor is connected to a terminal, other than the gate, of the other transistor;

9. Semiconductor memory device as described in claim 8, wherein:

the predetermined value is a threshold voltage of an n-channel transistor.

10. Semiconductor memory device as described in claim 8, wherein:

the precharge circuit includes a precharge which provides a precharge potential to gate the second pull down transistor ON prior to the voltage control transistor responding to the second active signal.

11. Semiconductor memory device as described in claim 8, wherein:

the semiconductor memory device is a dynamic random access memory (DRAM) device.

12. Semiconductor memory device as described in claim 8, wherein:

a discharge of said low voltage latch node to ground activates the cross-connected transistors to sense potential differentials between the sense lines.

13. Semiconductor memory device as described in claim 12, wherein:

the second active signal is provided a predetermined time after the first active signal, the predetermined time resulting in a time delay which coincides with a time required for sensing of potential differentials between the sense lines.

14. Semiconductor memory device as described in claim 13, wherein:

the second active signal gates ON the voltage control transistor to thereby supply a signal to the gate of said second pull down transistor which has the same potential as the low voltage latch node, thereby forming a diode configuration of the second pull down transistor.

15. Semiconductor memory device as described in claim 8, wherein:

the threshold current supply transistor is connected to the high potential voltage source through a diode-connected threshold junction device, so that when the threshold current supply transistor is gated ON in response to the second active signal, a leakage path through the threshold current supply transistor and threshold junction device provides a predetermined current to the low voltage latch node to float the low voltage latch node to the predetermined value above the potential of the low voltage source.

16. Semiconductor memory device as described in claim 15, wherein:

a circuit which includes the threshold current supply transistor and said diode connected threshold junction device has a high internal resistance relative to that of the first pull down transistor.

17. Semiconductor memory device as described in claim 16, wherein:

the semiconductor memory device is a dynamic random access memory (DRAM) device.

* * * * *